United States Patent
Li

(10) Patent No.: US 6,952,047 B2
(45) Date of Patent: Oct. 4, 2005

(54) ASSEMBLIES HAVING STACKED SEMICONDUCTOR CHIPS AND METHODS OF MAKING SAME

(75) Inventor: Delin Li, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/611,390

(22) Filed: Jul. 1, 2003

(65) Prior Publication Data

US 2004/0108581 A1 Jun. 10, 2004

Related U.S. Application Data

(60) Provisional application No. 60/393,026, filed on Jul. 1, 2002.

(51) Int. Cl.$^7$ ............................................... H01L 23/02
(52) U.S. Cl. ...................... 257/678; 438/107; 438/108; 438/109; 438/118; 438/455; 438/612; 438/613; 438/115; 438/117
(58) Field of Search ................................ 438/107, 108, 438/109, 118, 455, 612, 613, 115, 117

(56) References Cited

U.S. PATENT DOCUMENTS

| | | | |
|---|---|---|---|
| 4,941,033 A | 7/1990 | Kishida | |
| 4,982,265 A | 1/1991 | Watanabe et al. | |
| 5,046,238 A | 9/1991 | Daigle et al. | |
| 5,148,265 A | 9/1992 | Khandros et al. | |
| 5,148,266 A | 9/1992 | Khandros et al. | |
| 5,222,014 A | 6/1993 | Lin | |
| 5,347,159 A | 9/1994 | Khandros et al. | |
| 5,440,171 A | 8/1995 | Miyano et al. | |
| 5,455,740 A | 10/1995 | Burns | |
| 5,646,446 A | 7/1997 | Nicewarner, Jr. et al. | |
| 5,659,952 A | 8/1997 | Kovac et al. | |
| 5,679,977 A | 10/1997 | Khandros et al. | |
| 5,706,174 A | 1/1998 | Distefano et al. | |
| 6,169,328 B1 | 1/2001 | Mitchell et al. | |
| 6,573,609 B2 * | 6/2003 | Fjelstad et al. | ............. 257/778 |
| 6,673,651 B2 * | 1/2004 | Ohuchi et al. | ............. 438/107 |
| 6,709,895 B1 * | 3/2004 | Distefano | .................. 438/115 |

OTHER PUBLICATIONS

Brooks, Patent Application Publication, Aug. 14, 2003.*
Tan et al., Patent Application Publication, Aug. 7, 2003.*

* cited by examiner

Primary Examiner—Michael Tran
Assistant Examiner—Mai-Huong Tran
(74) Attorney, Agent, or Firm—Lerner, David, Littenberg, Krumholz & Mentlik, LLP

(57) ABSTRACT

A method of manufacturing a plurality of semiconductor chip packages and the resulting chip package assemblies. The method includes providing a circuitized substrate having terminals and leads. A first microelectronic element is arranged with the substrate and contacts on the microelectronic element are connected to the substrate. A conductive member is placed on top of the first microelectronic element and is used to support a second microelectronic element. The second microelectronic element is arranged with the conductive member in a top and bottom position. The second microelectronic element is then also connected by leads from contacts on the second microelectronic element to pads and terminals on the circuitized substrate. The conductive member is then connected to a third pad or set of pads on the substrate. An encapsulant material may be deposited so as to encapsulate the leads and at least one surface of the microelectronic elements. The encapsulant material is then cured thereby defining a composite of chip assemblies which may be singulated into individual chip packages.

24 Claims, 4 Drawing Sheets

ASSEMBLIES HAVING STACKED SEMICONDUCTOR CHIPS AND METHODS OF MAKING SAME

CROSS-REFERENCE TO RELATED APPLICATIONS

This application is based on U.S. Provisional Application No. 60/393,026 filed on Jul. 1, 2002, the teachings of which are incorporated herein by reference.

BACKGROUND OF THE INVENTION

The present invention relates to stacked microelectronic assemblies, to methods of forming such assemblies, and to components useful in such assemblies.

Semiconductor chips are commonly provided as individual, prepackaged units. A standard chip has a flat, rectangular body with a relatively expansive front face having contacts connected to the internal circuitry of the chip. Each individual chip is mounted in a package, which in turn is connected to a circuit panel, such as a printed circuit board, so that the contacts of the chip are connected to conductors of the circuit panel. In "flip-chip" designs, the front face of the chip faces the circuit panel, and the contacts on the chip are connected to the circuit panel by solder balls or other connecting elements. In many conventional designs, the chip package occupies an area of the circuit panel considerably larger than the area of the chip itself.

As disclosed, for example, in certain embodiments of commonly assigned U.S. Pat. Nos. 5,148,265, 5,148,266 and 5,679,977, the disclosures of which are hereby incorporated by reference herein, certain innovative mounting techniques offer compact assemblies with good reliability and testing approaches. A package which can accommodate a single chip in an area of the circuit panel equal to or slightly larger than the area of the chip itself is commonly referred to as a "chip-size package".

The total area of a plurality of chips mounted on a circuit panel is also a concern. Various proposals have been advanced for providing plural chips in a single package or module. It has been proposed to package plural chips in a "stacked" arrangement, i.e., an arrangement where chips are placed one on top of another. In a stacked arrangement, several chips can be mounted in an area of the circuit panel that is less than the total area of the chips. Certain stacked chip arrangements are disclosed, for example, in certain embodiments of the aforementioned '977 and '265 patents and in U.S. Pat. No. 5,347,159, the disclosures of which are hereby incorporated by reference herein. U.S. Pat. No. 4,941,033, also hereby incorporated by reference herein, discloses an arrangement in which chips are stacked one on top of another and interconnected with one another by conductors on so-called "wiring films" associated with the chips.

Still further improvements in stacked chip assemblies, for incorporating other elements within the assembly, would be desirable.

SUMMARY OF THE INVENTION

The present invention addresses these needs.

In a first aspect of the present invention, a microelectronic assembly comprises a first microelectronic element having a first face with first contacts exposed at the first face. The first face faces in a first direction. A second microelectronic element has a first side with second contacts exposed at the first side. The first side faces in a second direction opposite to the first direction. The assembly includes a substrate underlying the first microelectronic element and the second microelectronic element. The substrate has first terminals, second terminals, and at least one third terminal. The first contacts are connected to the first terminals and the second contacts are connected to the second terminals. A conductive member is disposed between the first microelectronic element and the second microelectronic element. The conductive member is connected to the at least one third terminal. An assembly according to this aspect desirably comprises a stacked arrangement of two microelectronic elements facing in opposite directions and having a conductive member disposed therebetween. The microelectronic elements are connected to a substrate having terminals for forming connections with external elements, such as circuit boards or other microelectronic elements. The conductive member may comprise a ground plane or an electromagnetic interference shield.

In certain preferred embodiments, the first face of the first microelectronic element faces the substrate and the first side of the second microelectronic element faces away from the substrate. The second microelectronic element desirably overlies the first microelectronic element. The substrate may have a first surface facing the first microelectronic element and the second microelectronic element. The substrate may also have a second surface facing in a direction opposite from the first surface. The features of the substrate desirably include pads exposed at the first surface of the substrate.

In certain preferred embodiments, the substrate includes first pads connected to the first terminals. The first contacts may be connected to the first pads. The first terminals are connected to the first pads and are desirably exposed at the second surface of the substrate. In certain preferred embodiments, the first pads are connected to the first contacts by masses of bonding material. A dielectric material is desirably disposed between the first face of the first microelectronic element and the first surface of the substrate, and in-between the masses of bonding material. A dielectric material may also be disposed over the substrate, first microelectronic element and second microelectronic element. Certain assemblies according to embodiments of the invention comprise a first microelectronic element attached to a substrate in a flip-chip arrangement.

The substrate may include second pads exposed at the first surface of the substrate and connected to the second terminals. The second contacts of the second microelectronic element may be connected to the second pads. In certain embodiments, the second contacts and second pads are connected by wires. The second terminals are desirably exposed at the second surface of the substrate. The terminals desirably include vias extending through the substrate.

The substrate may include at least one third pad connected to the at least one third terminal. The conductive element may be connected to the at least one third pad. The third terminal is desirably exposed at the second surface of the substrate. The conductive element may be connected to the at least one third pad by at least one wire.

In certain preferred embodiments, the second pads and at least one third pad are disposed outwardly from the first microelectronic element.

In certain preferred embodiments, the first microelectronic element has a second face facing oppositely from the first face and the second microelectronic element has a second side facing oppositely from the first side. The conductive element is desirably disposed between the second face and the second side. The conductive element may be adhered to the second face and second side.

The substrate may comprise an edge. The first pads are exposed at the first surface of the substrate. The first contacts may be connected to the first pads by a conductive element, such as a wire, extending transversely to the edge. The substrate may comprise an aperture and the first contacts may be connected to the first pads by a wire or other conductive element, extending through the aperture.

In certain preferred embodiments, the conductive member has a first width and the second microelectronic element has a second width less than the first width. The second microelectronic element overlies a first portion of the conductive member and a second portion of the conductive member lies outwardly of the second microelectronic element. The substrate may include at least one pad exposed at the first surface of the substrate, the at least one pad being connected to the at least one third terminal, and the conductive member may be connected to the at least one pad at the second portion of the conductive member, outwardly of the second microelectronic element.

In another aspect of the present invention, a method of making a microelectronic assembly comprises providing a substrate having a plurality of pads, including first pads, second pads and at least one third pad. The pads are exposed at a first surface of the substrate. A first microelectronic element is arranged with the substrate. The method includes connecting first contacts exposed on a first face of the first microelectronic element to the first pads on the substrate.

A second microelectronic element and a conductive member are arranged with the substrate and first microelectronic element so that the conductive member is disposed between the first microelectronic element and the second microelectronic element.

A first side of the second microelectronic element has second contacts exposed thereat. The second contacts are connected to the second pads and the conductive member is connected to the at least one third pad. Methods according to this aspect of the present invention provide a method of making a stacked microelectronic assembly having a conductive member disposed in the space between a first microelectronic element and a second microelectronic element. Methods according to embodiments of the present invention provide a method for forming electromagnetic shielding or a ground plane between microelectronic elements in a stacked electronic assembly. The assembly may comprise further microelectronic elements. The conductive member may comprise a plate of electrically conductive material. The conductive member may comprise an aluminum plate.

In certain preferred embodiments, the conductive member is connected to the first microelectronic element and the second microelectronic element is connected to the conductive member. In certain preferred embodiments, the conductive member is connected to the at least one third pad before the second contacts are connected to the second pads. The first face of the first microelectronic element may face the first surface of the substrate and the first contacts may be connected before the second contacts and the conductive member.

In certain preferred embodiments, the step of connecting the first contacts to the first pads includes disposing masses of bonding material between first contacts and the first pads. The step of connecting the first contacts to the first pads may include attaching wires to the first contacts and the first pads.

In certain preferred embodiments, the first microelectronic element has a second face facing in a direction opposite to the first face. The step of connecting the conductive member may include applying adhesive to the second face and attaching the conductive member to the second face. An adhesive may be applied to the conductive member and a second side of the second microelectronic element is attached to the conductive member. The second side of the microelectronic element faces in a direction opposite to the first side. The adhesive may be cured after the step of connecting the second microelectronic element to the conductive member. Methods according to certain embodiments of the present invention include a conductive member for shielding or ground connection that is disposed between two microelectronic elements facing in opposite directions.

The step of connecting the second contacts to the second pads may include attaching wires to the second contacts and the second pads. The conductive member may be connected to the at least one third pad by attaching wires to the conductive member and the third pad. The third pad may be arranged for connection with a ground or voltage source.

A flowable material is desirably introduced so as to surround at least the second contacts, second pads and third pads. A flowable material is desirably introduced between the first face of the first microelectronic element and the first surface of the substrate so as to surround the first pads and first contacts, after the step of connecting the first contacts to the first pads.

The conductive member may be wider than the second microelectronic element and a portion of the conductive member disposed outwardly of the second microelectronic element may be connected to the at least one third pad.

BRIEF DESCRIPTION OF THE DRAWINGS

These and other features, aspects and advantages of the present invention will become better understood with regard to the following description, appended claims and accompanying drawings where:

DETAILED DESCRIPTION

Figure 1:
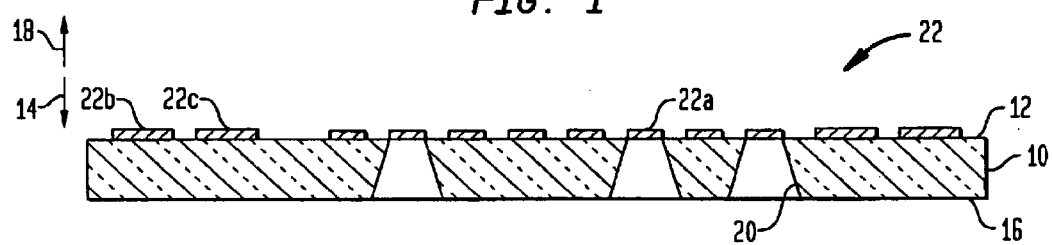
FIG. 1 is a cross-sectional view of the substrate with a plurality of vias.

An embodiment of the invention is shown in FIGS. 1–7. As shown in FIG. 1, a substrate 10 having a first surface 12 and a second surface 16 facing in a direction opposite from the first surface 12. The substrate desirably comprises a rigid or flexible sheet of dielectric material. The substrate 10 may comprise polyimide, other polymers, or other dielectric materials. The substrate may comprise FR4 or a circuit board material. The substrate includes a plurality of vias 20 extending from the first surface 12 to the second surface 16 and pads 22 aligned with the vias 20. The pads 22 include first pads 22a, second pads 22b and third pads 22c, as will be discussed further below.

The pads in the embodiments shown in FIG. 1 include first pads 22a disposed at a central region of the substrate 10 and second pads 22b and third pads 22c disposed outwardly of the first pads. However, in other embodiments, the pads may have different arrangements with respect to one another.

Figure 2:
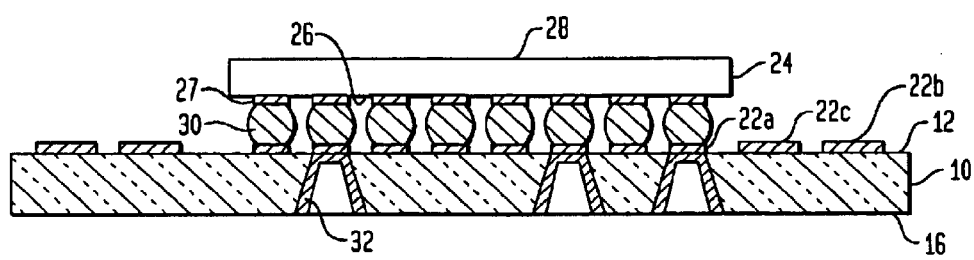
FIG. 2 is a cross-sectional view of the substrate with a first microelectronic element overlying the substrate.
Figure 3:
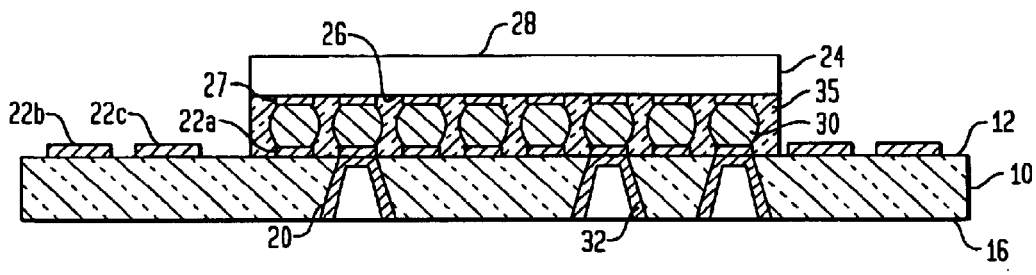
FIG. 3 is a cross-sectional view depicting the substrate and first microelectronic element at a later stage in the method.

A first microelectronic element 24 having a first face 26 facing in a first direction 14 and having a plurality of contacts 27 exposed at the first face 26, is arranged with the substrate 10 so that the contacts 27 face the first pads 22a on the first surface 12. The first microelectronic element 24 has a second face 28 that faces in the second direction 18, in a direction opposite from the first face 26. In the embodiment shown, the contacts 27 are connected to the first pads 22a on the first surface 12. In certain preferred embodiments, the contacts 27 are connected to first pads 22a that are exposed at the second surface 16 of the substrate 10. In certain preferred embodiments, the first contacts 27 are bonded to the first pads 22a in a "flip-chip" arrangement with the substrate 10, as shown in FIG. 2. For example, masses of bonding material 30 are disposed between the first pads 22a and the first contacts 27. The masses of bonding material 30 are brought to the reflow temperature of the bonding material and are then allowed to solidify so as to form a bond with the first contacts 27 and the first pads 22a. The vias 20 desirably have conductive material 32 disposed therein so as to line the vias 20 and form a connection with the pads 22a. The conductive material 32 is used in forming connections with external circuitry so that the substrate 10 interconnects the microelectronic elements with external circuitry. The conductive material 32 may be deposited within the vias 20 before or after the first contacts 27 are connected to the first pads 22a, but preferably before. As is known in the art, the conductive material 32 may be deposited in the vias 20 utilizing methods such as sputtering or other methods known in the art. A first dielectric material 35 is desirably formed between the first face 26 and the first surface 12, as shown in FIG. 3. The first dielectric material 35 may be introduced between the first face 26 and first surface 12 by disposing a flowable material therebetween so that the flowable material penetrates between the masses of bonding material 30. The flowable material is then cured to form the first dielectric material 35. The first dielectric material 35 may be formed from a flowable, curable polymer.

Figure 4:
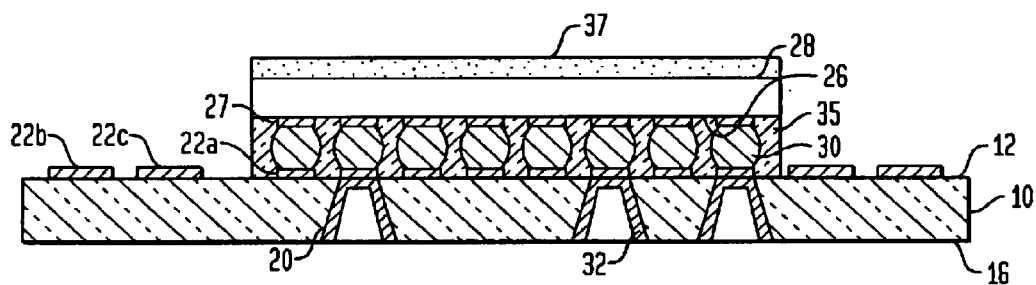
FIG. 4 is a cross-sectional view wherein an adhesive is overlying the first microelectronic element.
Figure 5:
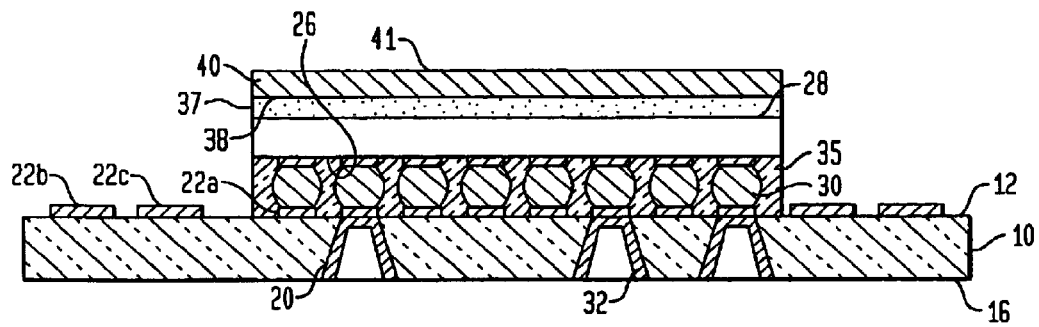
FIG. 5 is a cross-sectional view of a conductive element being placed on top of the first microelectronic element.
Figure 6:
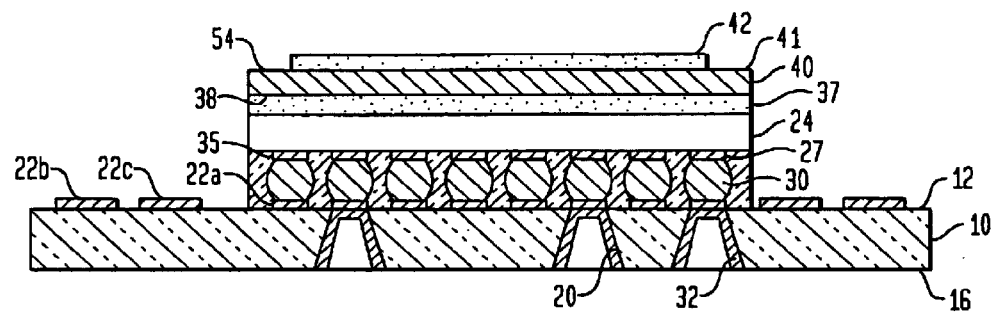
FIG. 6 is a cross-sectional view depicting the assembly of FIG. 5 at a later stage in the method.

A first layer of adhesive 37 is applied to the second face 28 of the first microelectronic element 24, as shown in FIG. 4. A first surface 38 of a conductive member 40 is attached to the second face 28 utilizing the adhesive 37, as shown in FIG. 5. A second layer of adhesive 42 is then applied to the second surface 41 of the conductive member 40. The second layer of adhesive 42 is then utilized to connect the second microelectronic element 45 to the conductive member 40, as shown in FIG. 6. The first layer of adhesive and the second layer of adhesive may comprise a flowable material applied onto the second face 28 and the second surface 41 of the conductive member 40. The first layer of adhesive 37 and second layer of adhesive 42 desirably comprise a thermal adhesive and the conductive member 40 may comprise a conductive plate, such as an aluminum plate. The conductive member 40 comprises any electrically conductive material.

Figure 7:
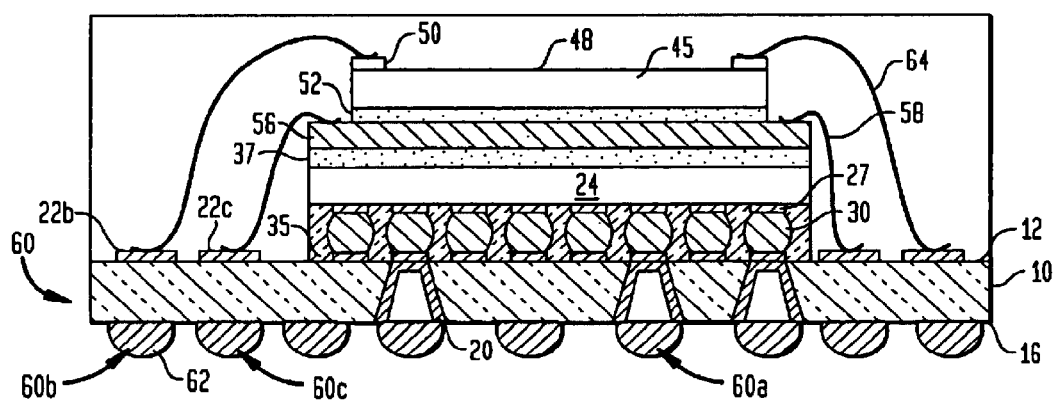
FIG. 7 is a cross-sectional view of packages formed in the method of FIGS. 1–6 with a second microelectronic element included overlying the assembly.

As shown in FIG. 7, the second microelectronic element 45 has a first side 48 with a plurality of second contacts 50 exposed at the first side 48. The second microelectronic element 45 has a second side 52 facing in an opposite direction from the first side 48. The second microelectronic element 45 is assembled with the conductive member 40 so that the second side 52 abuts against the second layer of adhesive 42, attaching the second side 52 to the second surface 41 of the conductive member 40. In certain preferred embodiments, the first layer of adhesive 37 and the second layer of adhesive 42 are cured by applying thermal or radiant energy to the adhesive layers. The second layer of adhesive 42 and second microelectronic element 45 are desirably smaller in width than the conductive member 40 so that after the second microelectronic element 45 is disposed on the conductive member 40, a first portion of the conductive member 40 is covered by the second microelectronic element 45, while a second portion 54 of the conductive member 40 lies outwardly of the second microelectronic element 45. This second portion 54 is then connected to the third pads 22c on the first surface 12 of the substrate 10. In certain preferred embodiments, wires 58 are attached at one end to third pads 22c and then connected at a second end to the second portion 54 of the conductive member 40. Thus, the second portion 54 lying outwardly of the second microelectronic element 45 is utilized to connect to the substrate 10. However, in other embodiments, an edge 56 of the conductive member may be used to connect to the third pads 22c.

The second contacts 50 are connected to the second pads 22b. In certain preferred embodiments, wires 64 are connected at one end to the second pads 22b and then connected at another end to the second contacts 50. The wires may be formed by a process known in the art as wire bonding. However, in other embodiments, other conductive features are utilized to connect the pads of the substrate 10 to the first contacts 27, the conductive member 40 and the second contacts 50. For example, any of these connections may be formed by masses of bonding material, such as solder, or by leads formed on the substrate 10, the first microelectronic element 24 and/or second microelectronic element 45, or provided separately.

The substrate 10 desirably has terminals 60 that are exposed at the second surface 16 of the substrate 10. The terminals may include solder balls 62, disposed in the vias 20. The solder balls 62 are desirably deposited so as to connect with the conductive material 32 in the vias 20. The terminals 60b include first terminals 60a that are connected to the first pads 22a, second terminals 60b that are connected to the second pads 22b and third terminals 60c that are connected to the third pads 22c. The terminals 60c are desirably arranged for forming the desired connections for the second contacts 50. The first terminals 60a are desirably arranged for forming the desired connections for the first contacts 27. The third terminals 60c are arranged to form connections for the conductive member 40, such as connections to a ground or voltage source, or other connections for electromagnetic interference shielding.

The substrate 10 may comprise one or more layers and may incorporate other features, such as traces or conductive planes. The pads and terminals carried by the substrate desirably comprise conductive materials commonly used to form electrical connections and used in making microelectronic elements and microelectronic components, such as copper and gold.

Figure 8:
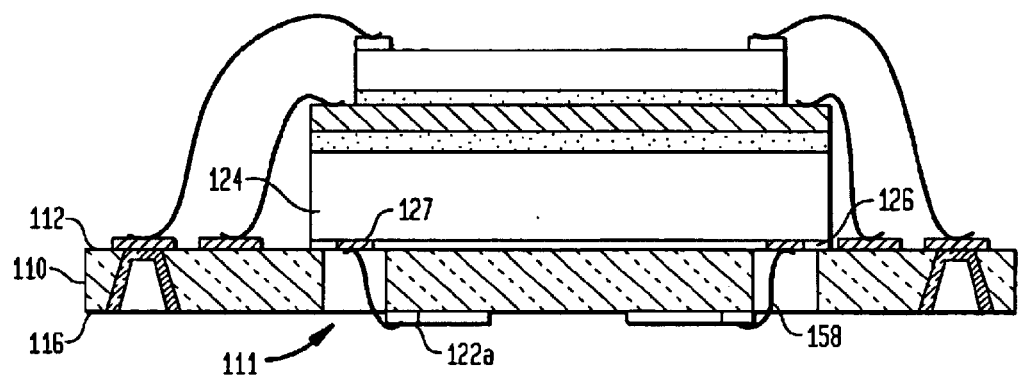
FIG. 8 is a cross-sectional view of an individual assembly formed in a method in accordance with a further embodiment of the present invention.

In other preferred embodiments, such as the embodiment shown in FIG. 8, the first microelectronic element 124 is assembled with the substrate 110 and at least one aperture 111 is utilized to connect the first contacts 127 to first pads 122a arranged on a surface of the substrate that faces away from the first microelectronic element 124. In certain preferred embodiments, wires 158 are attached at one end to the first contacts 127 and then attached at another end to the first pads 122a exposed on the second surface 116 of the substrate 110. A first face 126 of the first microelectronic element 124 faces the substrate 110 and may be attached to the substrate 110 using an adhesive. In certain preferred embodiments, a dielectric layer is formed between the first face 126 and second face 112. Such a dielectric layer may be formed as disclosed in certain embodiments of U.S. Pat. Nos. 5,679,977; 5,659,952; 5,706,174; and 6,169,328, the disclosures of which are hereby incorporated by reference herein.

Figure 9:
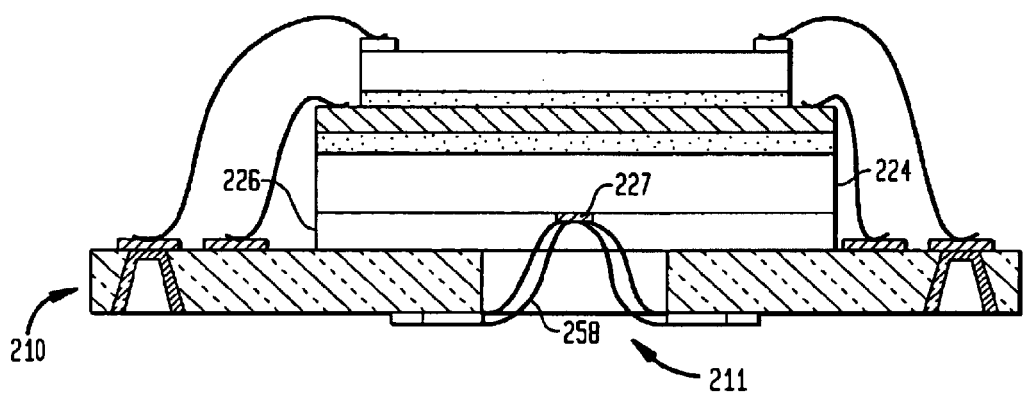
FIG. 9 is a cross-sectional view of an individual assembly formed in a method in accordance with another embodiment of the invention.

In another embodiment of the invention, a substrate 210 having one or more windows 211 and a plurality of leads 258 is assembled with the first microelectronic element 224. The first microelectronic element 224 shown in FIG. 9 has a first face 226 with a plurality of first contacts 227 exposed at a first face 226, in a central region of the first face. In other embodiments, contacts on the first microelectronic element and/or second microelectronic element are arranged in one or more rows in a central region, at the periphery or distributed across the face or side of the microelectronic element. The leads 258 and substrate 210 may be formed as disclosed in certain embodiments of U.S. Pat. No. 5,679,977, the disclosure of which is hereby incorporated by reference herein.

In other preferred embodiments, more than two microelectronic elements are incorporated within the assembly. For example, a dielectric pad may be mounted on the first side 48 of the second microelectronic element 45 shown in FIG. 7. Another conductive member 40 may be adhered to the pad and a third microelectronic element may be adhered to the conductive member. Alternatively, a third microelectronic element may be adhered to the dielectric pad on the first side 48. A stack of microelectronic elements according to embodiments of the present invention may comprise any number of microelectronic elements.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A microelectronic assembly, comprising:
   a) a first microelectronic element having a first face with first contacts exposed at the first face, the first face facing in a first direction;
   b) a second microelectronic element having a first side with second contacts exposed at the first side, the first side facing in a second direction opposite to the first direction;
   c) a substrate underlying the first microelectronic element and the second microelectronic element, the substrate having first terminals, second terminals and at least one third terminal, the first contacts being connected to the first terminals and the second contacts being connected to the second terminals; and
   d) a conductive member disposed between the first microelectronic element and the second microelectronic element, the conductive member being connected to at least one of the third terminals.

2. The assembly of claim 1, wherein the first face of the first microelectronic element faces the substrate and the first side of the second microelectronic element faces away from the substrate.

3. The assembly of claim 2, wherein the second microelectronic element overlies the first microelectronic element.

4. The assembly of claim 1, wherein the substrate has a first surface facing in the first direction and a second surface facing in the second direction.

5. The assembly of claim 4, wherein the substrate includes first pads exposed at the second surface of the substrate and connected to the first terminals, the first contacts being connected to the first pads.

6. The assembly of claim 5, wherein the first terminals are exposed at the first surface of the substrate.

7. The assembly of claim 5, wherein the first pads are connected to the first contacts by masses of bonding material.

8. The assembly of claim 7, further comprising a dielectric material disposed between the first face and the second surface of the substrate, and in-between the masses.

9. The assembly of claim 8, further comprising a dielectric material disposed over the substrate, first microelectronic element, and second microelectronic element.

10. The assembly of claim 6, wherein the first terminals include vias extending through the substrate.

11. The assembly of claim 5, wherein the substrate includes second pads exposed at the second surface of the substrate and connected to the second terminals, the second contacts of the second microelectronic element being connected to the second pads.

12. The assembly of claim 11, wherein the second contacts and second pads are connected by wires.

13. The assembly of claim 12, wherein the second terminals are exposed at the first surface of the substrate.

14. The assembly of claim 13, wherein the second terminals include vias extending through the substrate.

15. The assembly of claim 4, wherein the first microelectronic element has a second face facing oppositely from the first face and the second microelectronic element has a second side facing oppositely from the first side, the conductive member being disposed between the second face and the second side.

16. The assembly of claim 15, wherein the conductive element is adhered to the second face and the second side.

17. A microelectronic assembly, comprising:
   a) a first microelectronic element having a first face with first contacts exposed at the first face, the first face facing in a first direction;
   b) a second microelectronic element having a first side with second contacts exposed at the first side, the first side facing in a second direction opposite to the first direction;
   c) a substrate underlying the first microelectronic element and the second microelectronic element, the substrate having first terminals, second terminals and at least one third terminal, the first contacts being connected to the first terminals and the second contacts being connected to the second terminals;
   d) a conductive member disposed between the first microelectronic element and the second microelectronic element, the conductive member being connected to at least one of the third terminals,
      wherein the substrate has a first surface facing in the first direction and a second surface facing in a second direction;
      wherein the substrate includes first pads exposed at the second surface of the substrate and connected to the first terminals, the first contacts being connected to the first pads;

wherein the substrate includes second pads exposed at the second surface of the substrate and connected to the second terminals, the second contacts of the second microelectronic element being connected to the second pads; and wherein the substrate includes at least one third pad exposed at the first surface and the conductive member is connected to the third pad.

18. The assembly of claim 17, wherein the second pads and third pads are disposed outwardly from the first microelectronic element.

19. The assembly of claim 17, wherein the conductive element is connected to the third pad by wires.

20. A microelectronic assembly, comprising:
a) a first microelectronic element having a first face with first contacts exposed at the first face, the first face facing in a first direction;
b) a second microelectronic element having a first side with second contacts exposed at the first side, the first side facing in a second direction opposite to the first direction;
c) a substrate underlying the first microelectronic element and the second microelectronic element, the substrate having first terminals, second terminals and at least one third terminal, the first contacts being connected to the first terminals and the second contacts being connected to the second terminals;
d) a conductive member disposed between the first microelectronic element and the second microelectronic element, the conductive member being connected to at least one of the third terminals;
wherein the substrate has a first surface facing in the first direction and a second surface facing in the second direction;
wherein the substrate includes an aperture and first pads exposed at the first surface of the substrate, and the first contacts are connected to the first pads.

21. The assembly of claim 20, further comprising a dielectric material disposed between the first face and the second surface and in the aperture.

22. The assembly of claim 20, wherein the first contacts are connected to the first pads by wires that extend through the aperture.

23. A microelectronic assembly, comprising:
a) a first microelectronic element having a first face with first contacts exposed at the first face, the first face facing in a first direction;
b) a second microelectronic element having a first side with second contacts exposed at the first side, the first side facing in a second direction opposite to the first direction;
c) a substrate underlying the first microelectronic element and the second microelectronic element, the substrate having first terminals, second terminals and at least one third terminal, the first contacts being connected to the first terminals and the second contacts being connected to the second terminals;
d) a conductive member disposed between the first microelectronic element and the second microelectronic element, the conductive member being connected to at least one of the third terminals;
wherein the first face of the first microelectronic element faces the substrate and the first side of the second microelectronic element faces away from the substrate;
wherein the second microelectronic element overlies the first microelectronic element; and
wherein the conductive member has a first width and the second microelectronic element has a second width less than the first width so that the second microelectronic element overlies a first portion of the conductive member and a second portion of the conductive member lies outwardly of the second microelectronic element.

24. The assembly of claim 23, wherein the substrate includes pads exposed at the second surface of the substrate, the pads being connected to the at least one third terminal, and the conductive member is connected to the pads, at the second portion of the conductive member.

* * * * *